(12) United States Patent
Jairazbhoy et al.

(10) Patent No.: US 6,169,253 B1
(45) Date of Patent: Jan. 2, 2001

(54) SOLDER RESIST WINDOW CONFIGURATIONS FOR SOLDER PASTE OVERPRINTING

(75) Inventors: Vivek Amir Jairazbhoy, Farmington Hills; Richard Keith McMillan, Dearborn, both of MI (US)

(73) Assignee: Visteon Global Technologies, Inc., Dearborn, MI (US)

( * ) Notice: Under 35 U.S.C. 154(b), the term of this patent shall be extended for 0 days.

(21) Appl. No.: 09/093,079

(22) Filed: Jun. 8, 1998

(51) Int. Cl.[7] ................................. H05K 1/18; H05K 3/34
(52) U.S. Cl. ..................... 174/250; 174/256; 174/260; 361/748; 361/760; 361/767; 361/768; 361/771; 29/830; 29/840; 228/180.21; 228/180.22
(58) Field of Search ....................... 361/748–751, 361/743, 760, 767, 768, 771, 777, 782, 783, 808; 174/250, 255–261; 29/832, 840, 830, 831; 228/180.21, 180.22, 248.1, 254; 427/96; 438/108, 119

(56) References Cited

U.S. PATENT DOCUMENTS

| | | | |
|---|---|---|---|
| 5,132,864 | * 7/1992 | Takemura et al. | 361/777 |
| 5,357,060 | * 10/1994 | Yamashita | 361/777 |
| 5,386,087 | 1/1995 | Lee et al. | 174/261 |
| 5,425,647 | * 6/1995 | Mencik et al. | 361/768 |
| 5,453,581 | 9/1995 | Liebman et al. | 174/261 |
| 5,486,657 | 1/1996 | Bell et al. | 174/261 |
| 5,644,475 | 7/1997 | Woychik et al. | 174/261 |
| 5,707,714 | * 1/1998 | Furutatsu et al. | 174/261 |

* cited by examiner

Primary Examiner—Jeffrey Gaffin
Assistant Examiner—John B. Vigushin
(74) Attorney, Agent, or Firm—Leslie C. Hodges

(57) ABSTRACT

There is disclosed herein an electronic circuit assembly, such as a printed circuit board, having solder resist windows with one or more enlarged solder resist pullback zones, thereby facilitating solder paste overprinting.

21 Claims, 3 Drawing Sheets

SOLDER RESIST WINDOW CONFIGURATIONS FOR SOLDER PASTE OVERPRINTING

BACKGROUND OF THE INVENTION

1. Field of the Invention

The present invention relates generally to solderable electronic circuit assemblies, and more particularly to electronic circuit assemblies having solder resist windows which facilitate solder paste overprinting.

2. Disclosure Information

Traditional electronic circuit assemblies (such as printed circuit boards) generally includes a substrate 20 with conductive circuit traces 22 and mounting pads 24 thereon, as shown in FIG. 1. Once the traces and pads have been placed on the substrate, a thin, solder-resistant layer of material known as "solder resist" 28 is typically applied over the surface of the substrate.

The solder resist layer 28 typically covers substantially all of the circuit traces, but not the mounting pads; this is accomplished by forming windows 30 in the solder resist such that each window 30 generally conforms in shape with and is situated concentrically about a respective mounting pad 24. The edges 35 of each window 30 generally conform with and run generally parallel to adjacent, corresponding edges 25 of the mounting pad 24, as shown in FIG. 1. Typically, all the window edges 35 are spaced apart from their respective pad edges 25 by the same distance P; this distance P is commonly referred to as the "pullback". For screenprinted solder resist, the pullback P is typically about 10–20 mils, whereas for liquid photoimageable solder resist (LPISM) the pullback P is typically 0–5 mils.

While it is preferred to keep the solder resist window at least as large as the respective pads at a minimum, it is common industry practice—and, in fact, a tenet of industry design standards (e.g., ANSI/IPC-D-275)—to keep the pullback P as small as possible. One reason for this is to conserve real estate on the substrate; making the solder resist openings/pullback larger rather than smaller takes up valuable board space. It is also common practice and teaching to use the same phototool to produce the masks/stencils needed for laying down the mounting pads, the solder resist layer/windows, and the solder paste depositions. For example, a given phototool may be (1) non-magnified to produce the mounting pad mask, (2) magnified to produce the solder resist layer/window mask, and (3) de-magnified to produce the solder paste stencil. This avoids having to independently design three separate masks/stencils, and making them from the same phototool provides better registration, and better avoids tool-to-tool discrepancies, than if three separate phototools were used.

Once the solder resist is applied to the substrate surface, the mounting pads and any other circuit structures exposed through the windows may be tinned, followed by solder paste being applied thereto, typically by screen-printing or deposition. When solder paste is applied to mounting pads, the common practice is to print or deposit paste-to-pad in a 1:1 or less ratio, as illustrated by the smaller-than-mounting pad deposition 40 illustrated in FIG. 1. For example, for a typical 90×140-mil rectangular mounting pad, the solder deposited atop such a pad will usually be a similarly shaped deposition measuring 90×140 mils or less (e.g., 60×100 mils) that is centered with respect to the pad. After the paste has been printed/deposited, and the substrate populated with electronic components, the populated assembly is then subjected to reflow processing.

Applicants have discovered that it may be advantageous in some applications to go against standard industry practice and to intentionally overprint the mounting pads. For example, for a 90×140-mil pad, a 120×180-mil solder paste deposition may be desired. Such overprinting may be useful, for instance, in the creation of specially shaped solder joints during reflow. Applicants believe it is preferable to position the overprinted deposition such that substantially all of the deposition lies on the pad 24 and on one or more outboard edges 26 of the pad. (As used herein, the "outboard" edges 26/36 of the pad 24 and window 30 are those which are located generally outside the component footprint 50, while the "inboard" edges 27/37 are those which are generally within the footprint 50. For example, in FIG. 1, each rectangular mounting pad 24 and window 30 has one inboard edge 27/37 and three outboard edges 26/36.)

However, if one were to follow standard industry practice in providing a 0- to 20-mil pullback between the pad and window edges, there would not be enough room between the pad edges 26 and the window edges 36 in which to overprint the paste without printing onto the adjacent outboard solder resist layer 28, as illustrated by reference numeral 42 in FIG. 1. Overprinting onto the solder resist layer 28 is undesirable because there would then be an increased risk of forming migratory solder balls and/or solder bridges between adjacent pads during reflow.

Therefore, it would be advantageous to provide a way of accommodating the desire to overprint which overcomes the aforementioned drawback.

SUMMARY OF THE INVENTION

The present invention overcomes the disadvantages of prior art approaches by providing an electronic circuit assembly offering improved overprintability. One configuration of the assembly comprises: (a) a dielectric substrate having a plurality of circuit traces and at least one mounting pad disposed thereon, wherein each mounting pad is arranged in matched relation with a respective termination of a surface-mount electronic component; and (b) a solder resist layer generally covering the substrate and having at least one window therethrough, wherein each window has at least one inboard window edge generally within a projected footprint of the electronic component and at least one outboard window edge generally outside the footprint, wherein each window generally conforms in shape with and is arranged about a respective one of the mounting pads. Each inboard window edge is spaced a first predetermined pullback distance P1 away from a respective adjacent inboard mounting pad edge, and each outboard window edge is spaced a second predetermined pullback distance P2 away from a respective adjacent outboard mounting pad edge, such that P2>P1 for at least one of the at least one outboard window edge.

It is an object and advantage that the solder resist windows of the present invention provide one or more enlarged pullback zones outboard from the component footprint into which solder paste may be deposited, thereby facilitating solder paste overprinting.

These and other advantages, features and objects of the invention will become apparent from the drawings, detailed description and claims which follow.

DETAILED DESCRIPTION OF THE PREFERRED EMBODIMENTS

Figure 1:
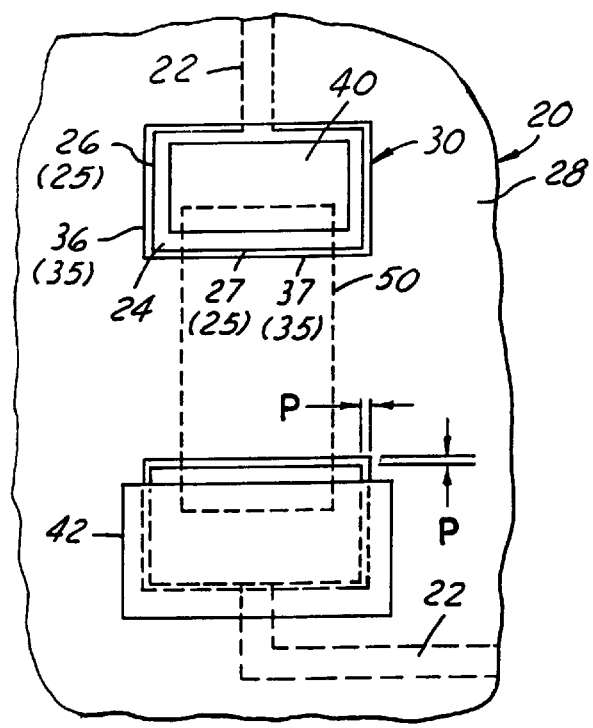
FIG. 1 is a plan view of an electronic circuit assembly after solder paste deposition and before component population, according to the prior art.

Referring now to the drawings, FIGS. 2–8 show various configurations of an electronic circuit assembly having improved overprintability according to the present invention. One configuration of the assembly comprises: (a) a dielectric substrate 20 having a plurality of circuit traces 22 and at least one mounting pad 24 disposed thereon, wherein each mounting pad is arranged in matched relation with a respective termination of a surface-mount electronic component; and (b) a solder resist layer 28 generally covering the substrate and having at least one window 30 therethrough, wherein each window has at least one inboard window edge 37 generally within a projected footprint 50 of the electronic component and at least one outboard window edge 36 generally outside the footprint 50, wherein each window 30 generally conforms in shape with and is arranged about a respective one of the mounting pads 24. Each inboard window edge 37 is spaced a first predetermined pullback distance P1 away from a respective adjacent inboard mounting pad edge 27, and each outboard window edge 36 is spaced a second predetermined pullback distance P2 away from a respective adjacent outboard mounting pad edge 26, such that P2>P1 for at least one of the at least one outboard window edge 36.

To assist the reader in understanding the present invention, all reference numbers used herein are summarized in the table below, along with the elements they represent:

20=Dielectric substrate (e.g., FR-4)
22=Circuit trace
24 Mounting pad
25=Edges of mounting pad
26=Outboard edge(s) of mounting pad
27=Inboard edge(s) of mounting pad
28=Solder resist layer
30=Window in solder resist
35=Edges of window
36=Outboard edge(s) of window
$36_2$=Second lateral outboard window edge
$36_3$=Third lateral outboard window edge
$36_4$=Fourth outboard window edge
37=Inboard edge(s) of window
40=Solder paste deposition (typical/underprinted)
42=Solder paste deposition (overprinted onto resist)
44=Solder paste deposition (overprinted within overprint zone)
50=Footprint of electronic component
60=Phantom line indicating where prior art window edge would be located
70=Overprint zone(s) provided by additional pullback of outboard window edge(s)
P=Pullback of solder resist edge from pad edge
P1=First predetermined distance between inboard edges of pad and window
P2=Second predetermined distance between outboard edges of pad and window The dielectric substrate 20 may be a conventional flat, planar FR-4 glass/epoxy laminate; a semi-rigid to rigid plastic part (e.g., molded out of ABS or polypropylene); a flexible polyester, polyimide, or polyetherimide film; and so forth. The circuit traces 22 are typically copper, and the mounting pads 24 are typically rectangular or round copper pads which are formed on the substrate 20 by well-known plating and etching processes. The electronic component is preferably a surface mount component (SMC) with two or more terminations thereon, such as a bi-terminated leadless chip component (LCC) such as a 2512 resistor; however, in some cases (e.g., wirebonded power transistors), the component may have only a single termination that is placed on a mounting pad, so only one mounting pad 24 is required for the present invention.

The solder resist 28 is a generally non-solder-wettable layer attached to the top surface of the substrate 20. The resist 28 typically has at least two windows 30 therein (but may have only one), wherein each window generally conforms in shape with, and is arranged about a respective one of, the at least one mounting pad 24. For example, if a given mounting pad is rectangular, the corresponding window about this pad will be similarly rectangular (and usually, but not necessarily, larger in length and width than the pad).

Figure 2:
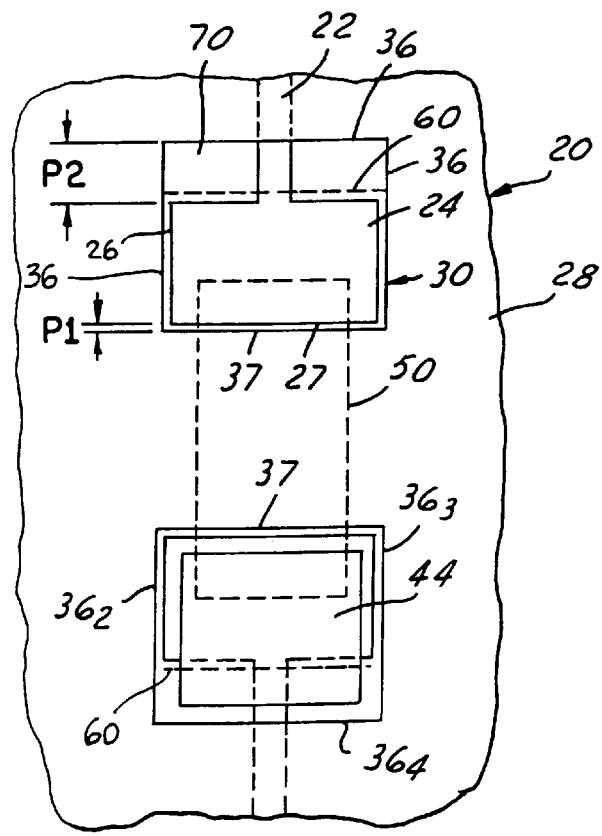
FIGS. 2–5 are various plan views of an electronic circuit assembly after solder paste deposition and before component population, according to the present invention.
Figure 3:
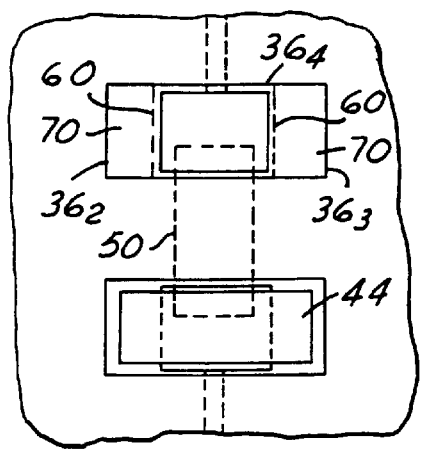
Figure 4:
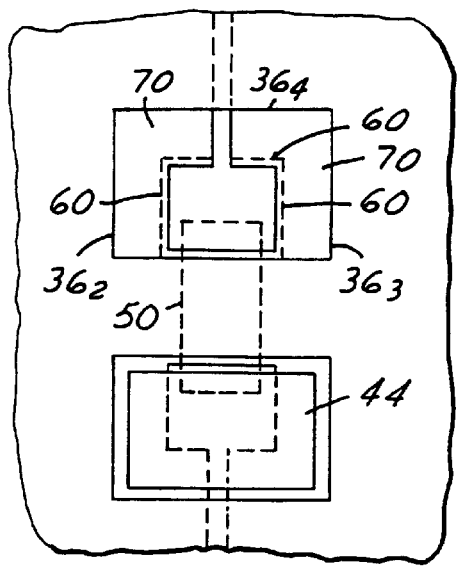

As illustrated in FIGS. 2–4, each window 30 has at least one inboard window edge 37 located generally within a projected footprint 50 of the component. The footprint 50 generally conforms to the underside surface of the component as projected onto the substrate top surface. Each window 30 also includes at least one outboard window edge 36 located generally outside the footprint 50. Each inboard window edge 37 is generally disposed along and proximate to a corresponding inboard mounting pad edge 27 with a first predetermined distance or gap P1 therebetween, while each outboard window edge 36 is generally disposed along and proximate to a corresponding outboard mounting pad edge 26 with a second predetermined distance or gap P2 therebetween. The gap P1 between the inboard mounting pad and window edges 27/37 is typically kept the same as in the prior art; namely, generally between 0 and 20 mils. However, the gap P2 between one or more respective outboard mounting pad and window edges 26/36 is generally at least 10 mils larger than P1.

Figure 5:
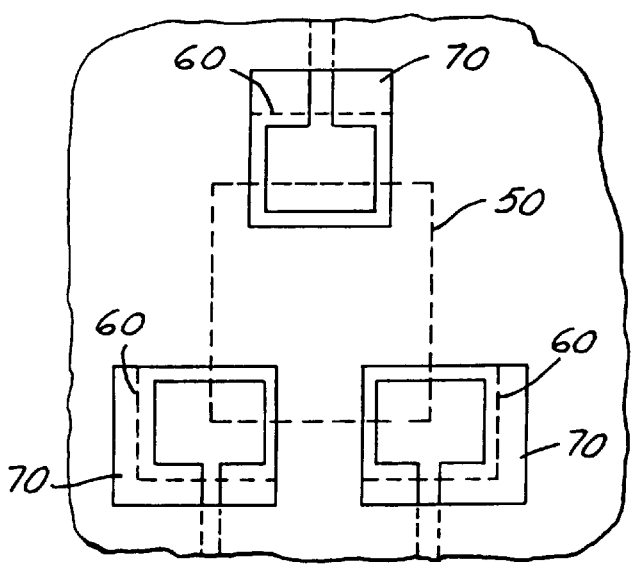
Figure 6:
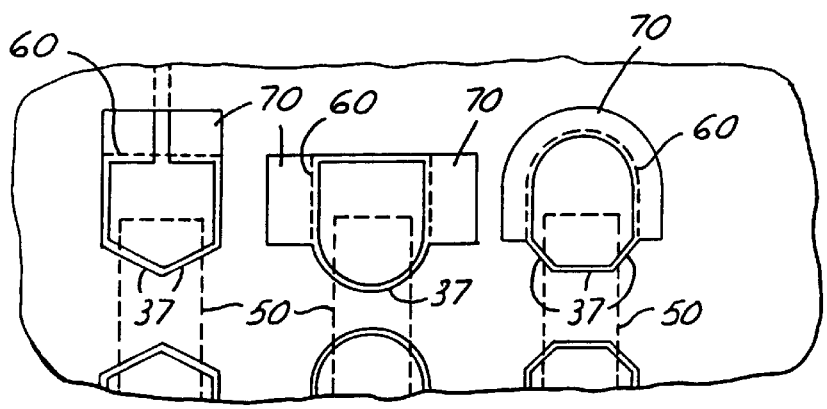
FIGS. 6–8 are plan views of an electronic circuit assembly showing various mounting pad/window configurations according to the present invention.

In most actual applications, the mounting pads 24 are rectangular in shape, as illustrated in FIGS. 2–5. In such a case, the at least one inboard window edge 37 comprises a single first inboard window edge, while the at least one outboard window edge comprises: (a) second and third lateral window edges $36_2/36_3$ each contiguous with and generally orthogonal to the first inboard window edge, and (b) a single fourth window edge $36_4$ generally parallel with the first inboard window edge and contiguous at each end thereof with a respective one of the second and third lateral window edges $36_2/36_3$. Alternatively, the pads 24 may be round, or may have a combination of straight and arcuate edges, as illustrated in FIG. 6. The at least one inboard window/pad edge may comprise a single straight or arcuate edge, or multiple straight/arcuate edges. Likewise, the one or more outboard window/pad edge may comprise, for example, a single arcuate outboard edge, two straight edges forming a "V" shape, three straight edges forming three sides of a rectangle, and so forth. The configurations shown in the drawings are merely representative of the various configurations possible, and are not intended to encompass all the possible configurations within the scope of the present invention.

Three different embodiments are illustrated in FIGS. 2–4. In FIG. 2, P2>P1 for only the fourth outboard window edge $36_4$, while gap P2 is generally equal to gap P1 with respect to the second and third lateral edges $36_2/36_3$. In FIG. 3, the reverse is true; P2>P1 for the second and third lateral edges $36_2/36_3$, while P2≈P1 for the fourth edge $36_4$. And in FIG. 4, P2>P1 for all three of the outboard window edges $36_2/36_3/36_4$.

Note that phantom lines 60 indicate where the solder resist window edge(s) 36 would be placed according to conventional, prior art approaches; this helps to show how the window 30 has been selectively enlarged in each case to provide one or more "overprint zones" 70 to accommodate a desired overprinting strategy. In FIGS. 2–4, one of the two mounting pads 24 shown includes an overprinted solder paste deposition 44 thereon. In each case, the deposition 44 extends beyond one or more outboard edges 26 of the mounting pad 24; however, unlike prior art overprinting strategies which extend paste onto the solder resist 28, the selectively enlarged outboard window edges of the present invention provide solder-resist-free overprint zones 70 into which the paste may extend. This helps prevent solder balls from migrating across the solder resist; furthermore, the zones 70 tend to keep any solder balls contained therein, since the higher, surrounding window edge 36 acts as a wall or barrier which the solder ball would have to climb over to escape.

Figure 7:
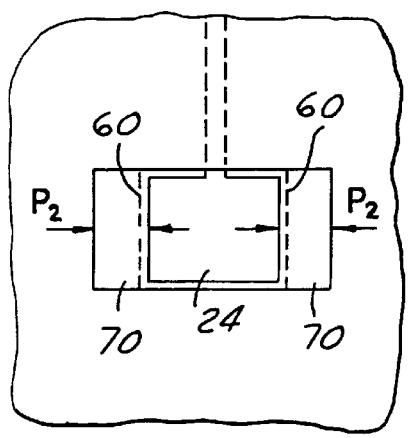
Figure 8:
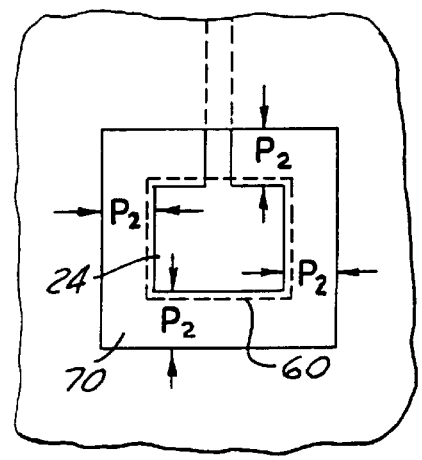

It should be noted that although FIGS. 2–4 show pad/window configurations for a component having only two terminations, components having other than two terminations may be accommodated by the present invention. For example, FIG. 5 illustrates a pad/window configuration for a component having three terminations in a triangular arrangement. Additionally, FIGS. 7–8 illustrate cases wherein the component has only a single termination to be bonded to a substrate mounting pad 24. For instance, such a component might be a power transistor whose bottom surface is to be soldered to a single mounting pad, and whose two top-surface aluminum bond pads are to be wirebonded to an adjacent connector leadframe (not shown). In such a case, there is no "inboard" mounting pad/window edge, only one or more "outboard" edges. (For round pads 24, there would be a single arcuate outboard edge, while for the rectangular pads 24 shown there would be four straight outboard edges.) For these applications, the window may be selectively widened to provide one or more overprint zones 70 about the pad. In FIG. 7, two overprint zones 70 are provided, while in FIG. 8, an overprint zone 70 is provided about the entire perimeter of the pad. (Or, FIG. 8 may be viewed as having four contiguous zones 70, one adjacent to each of the four pad edges.) In such single-pad applications, the main difference between the prior art and the approaches illustrated here is that the gap or width P2 of each overprint zone 70 is dramatically larger than the 0- to 20-mil pullback recommended by conventional industry design standards and practice.

Various other modifications to the present invention will, no doubt, occur to those skilled in the art to which the present invention pertains. For example, although reference is made herein to "solder", "solder paste", and "reflow" processing, the present invention applies equally to forming joints with conductive adhesive rather than solder paste, and optionally using an alternative heating or curing process (e.g., ultraviolet/infrared/laser radiation, exposure to hot air or other gases, etc.) other than conventional reflow oven processing. Also, it should be understood that "overprinting" is not limited to the use of conventional screenprinting, but may also include dispensing, transfer printing, compression printing, solder preform placement, or other methods for placing bonding material (i.e., solder paste, conductive adhesive, etc.) in distinct, predetermined depositions atop the PCB mounting pads. Additionally, while the drawings show each window edge 36/37 being generally parallel to or conforming in contour with its respective pad edge 26/27, it is also possible that the respective edges may deviate in shape from one another, if desired. Other modifications not specifically mentioned herein are also possible and within the scope of the present invention. It is the following claims, including all equivalents, which define the scope of the present invention.

What is claimed is:

1. An electronic circuit assembly, comprising:
   a dielectric substrate having a plurality of circuit traces and at least one mounting pad disposed thereon, wherein each mounting pad is arranged in matched relation with a respective termination of a surface-mount electronic component; and
   a solder resist layer generally covering said substrate and having at least one window therethrough, wherein each window has at least one inboard window edge generally within a projected footprint of the electronic component and at least one outboard window edge generally outside said footprint, wherein each window generally conforms in shape with and is arranged about a respective one of said mounting pads,
   wherein each inboard window edge is spaced a first predetermined pullback distance P1 away from a respective adjacent inboard mounting pad edge and wherein each outboard window edge is spaced a second predetermined pullback distance P2 away from a respective adjacent outboard mounting pad edge,
   such that P2>P1 with respect to at least one of said at least one outboard window edge.

2. An electronic circuit assembly according to claim 1, wherein P1 is generally between 0 and 20 mils.

3. An electronic circuit assembly according to claim 2, wherein P2 is generally at least 10 mils larger than P1.

4. An electronic circuit assembly according to claim 1, wherein each mounting pad is generally round or generally rectangular.

5. An electronic circuit assembly according to claim 1,
   (a) wherein each mounting pad and window is generally rectangular, and
   (b) wherein said at least one inboard window edge comprises a first inboard window edge, and
   (c) wherein said at least one outboard window edge comprises:
      (i) second and third lateral window edges each contiguous with and generally orthogonal to said first inboard window edge, and
      (ii) a fourth window edge generally parallel with said first inboard window edge and contiguous at each end thereof with a respective one of said second and third lateral window edges.

6. An electronic circuit assembly according to claim 5, wherein P2=P1 with respect to each of said second and third lateral window edges, and P2>P1 with respect to said fourth window edge.

7. An electronic circuit assembly according to claim 5, wherein P2≈P1 with respect to said fourth window edge, and P2>P1 with respect to each of said second and third lateral window edges.

8. An electronic circuit assembly according to claim 5, wherein P2>P1 with respect to each of said second, third, and fourth window edges.

9. An electronic circuit assembly, comprising:
(a) a dielectric substrate having a plurality of circuit traces and at least one generally rectangular mounting pad disposed thereon, wherein each mounting pad is arranged in matched relation with a respective termination of a surface-mount electronic component; and
(b) a solder resist layer generally covering said substrate and having at least one generally rectangular window therethrough, wherein each window generally conforms in shape with and is arranged about a respective one of said at least one mounting pad and has:
  (i) a first inboard window edge located generally within a projected footprint of the electronic component,
  (ii) second and third lateral window edges located generally outside said footprint each contiguous with and generally orthogonal to said first inboard window edge, and
  (iii) a fourth window edge located generally outside said footprint and generally parallel with said first inboard window edge, wherein said fourth window edge is contiguous at each end thereof with a respective one of said second and third lateral window edges,
(c) wherein said first inboard window edge is spaced a first predetermined pullback distance P1 away from a respective adjacent inboard mounting pad edge and wherein each second, third and fourth window edge is spaced a second predetermined pullback distance P2 away from a respective adjacent outboard mounting pad edge,
(d) such that P2>P1 with respect to at least one of said second, third and fourth window edges.

10. An electronic circuit assembly according to claim 9, wherein P2≈P1 with respect to each of said second and third lateral window edges, and P2>P1 with respect to said fourth window edge.

11. An electronic circuit assembly according to claim 9, wherein P2≈P1 with respect to said fourth window edge, and P2>P1 with respect to each of said second and third lateral window edges.

12. An electronic circuit assembly according to claim 9, wherein P2>P1 with respect to each of said second, third, and fourth window edges.

13. An electronic circuit assembly according to claim 9, wherein P1 is generally between 0 and 20 mils.

14. An electronic circuit assembly according to claim 13, wherein P2 is generally at least 10 mils larger than P1.

15. An electronic circuit assembly, comprising:
(a) a dielectric substrate having a plurality of circuit traces and at least one generally rectangular mounting pad disposed thereon, wherein each mounting pad is arranged in matched relation with a respective termination of a surface-mount electronic component; and
(b) a solder resist layer generally covering said substrate and having at least one generally rectangular window therethrough, wherein each window generally conforms in shape with and is arranged about a respective one of said at least one mounting pad and has:
  (i) a first inboard window edge located generally within a projected footprint of the electronic component,
  (ii) second and third lateral window edges located generally outside said footprint each contiguous with and generally orthogonal to said first inboard window edge, and
  (iii) a fourth window edge located generally outside said footprint and generally parallel with said first inboard window edge, wherein said fourth window edge is contiguous at each end thereof with a respective one of said second and third lateral window edges,
(c) wherein said first inboard window edge is spaced a first predetermined pullback distance P1 away from a respective adjacent inboard mounting pad edge and wherein each second, third and fourth window edge is spaced a second predetermined pullback distance P2 away from a respective adjacent outboard mounting pad edge,
(d) wherein P2>P1 with respect to each of said second, third, and fourth window edges.

16. An electronic circuit assembly according to claim 15, wherein P1 is generally between 0 and 20 mils.

17. An electronic circuit assembly according to claim 16, wherein P2 is generally at least 10 mils larger than P1.

18. A method for producing a printed circuit board, comprising the steps of:
(a) providing:
  (i) a dielectric substrate having a plurality of circuit traces and at least one mounting pad disposed thereon, wherein each mounting pad is arranged in matched relation with a respective termination of a surface-mount electronic component; and
  (ii) a solder resist layer generally covering the substrate and having at least one window therethrough, wherein each window has at least one inboard window edge generally within a projected footprint of the electronic component and at least one outboard window edge generally outside the footprint, wherein each window generally conforms in shape with and is arranged about a respective one of the mounting pads,
  (iii) wherein each inboard window edge is spaced a first predetermined pullback distance P1 away from a respective adjacent inboard mounting pad edge, and wherein each outboard window edge is spaced a second predetermined pullback distance P2 away from a respective adjacent outboard mounting pad edge so as to provide an enlarged solder resist-free region therebetween,
  (iv) such that P2>P1 with respect to at least one of the at least one outboard window edge; and
(b) depositing solder paste atop substantially all of the mounting pad surface and within substantially all of each enlarged solder resist-free region.

19. A method according to claim 18, wherein said step of depositing solder paste includes at least one of screenprinting, compression printing, solder preform placement, and dispensing.

20. A method according to claim 18, further comprising the steps of:
(c) placing a surface mount component atop the substrate with one component termination registered atop the solder paste on the mounting pad;
(d) heating the solder paste so as to form a molten solder joint bridging the mounting pad and the component termination, wherein the molten solder joint is wicked atop substantially only the mounting pad; and
(e) cooling the molten solder joint so as to form a solid solder joint electrically and mechanically connecting the mounting pad to the component termination, wherein the solid solder joint remains atop substantially only the mounting pad.

21. A method according to claim 20, wherein said step of heating the solder paste includes at least one of reflow oven heating, laser soldering, ultraviolet/infrared radiation, and exposure to hot air or other gases.

* * * * *